United States Patent
Huyghebaert et al.

(10) Patent No.: US 9,982,360 B2
(45) Date of Patent: May 29, 2018

(54) METHOD FOR TRANSFERING A GRAPHENE LAYER

(71) Applicant: IMEC VZW, Leuven (BE)

(72) Inventors: Cedric Huyghebaert, Leuven (BE); Philippe M. Vereecken, Luik (BE); Geoffrey Pourtois, Villers-la-Ville (BE)

(73) Assignee: IMEC VZW, Leuven (BE)

( * ) Notice: Subject to any disclaimer, the term of this patent is extended or adjusted under 35 U.S.C. 154(b) by 827 days.

(21) Appl. No.: 14/486,678

(22) Filed: Sep. 15, 2014

(65) Prior Publication Data
US 2015/0079399 A1    Mar. 19, 2015

(30) Foreign Application Priority Data

Sep. 17, 2013 (EP) .................................. 13184696

(51) Int. Cl.
| | |
|---|---|
| *C25F 5/00* | (2006.01) |
| *C01B 32/19* | (2017.01) |
| *C01B 32/194* | (2017.01) |
| *H01L 21/18* | (2006.01) |
| *B32B 37/00* | (2006.01) |
| *B32B 38/00* | (2006.01) |

(52) U.S. Cl.
CPC .............. *C25F 5/00* (2013.01); *B32B 37/025* (2013.01); *B32B 38/0008* (2013.01); *C01B 32/19* (2017.08); *C01B 32/194* (2017.08); *H01L 21/187* (2013.01); *Y10T 428/30* (2015.01)

(58) Field of Classification Search
CPC .......... C25F 5/00; C01B 32/19; C01B 32/194
See application file for complete search history.

(56) References Cited

U.S. PATENT DOCUMENTS

| | | |
|---|---|---|
| 2012/0244358 A1 | 9/2012 | Lock et al. |
| 2012/0248401 A1 | 10/2012 | Shin et al. |
| 2013/0210218 A1* | 8/2013 | Accardi ............ H01L 21/02527 438/478 |

FOREIGN PATENT DOCUMENTS

WO   WO-2013043120 A1 *  3/2013  ......... C01B 31/0469

OTHER PUBLICATIONS

De Heer et al. "Large area and structured epitaxial graphene produced by confinement controlled sublimation of silicon carbide" 16900-16905, PNA, Oct. 11, 2011, vol. 108, No. 41.
De La Rosa et al. "Frame assisted $H_2O$ electrolysis induced $H_2$ bubbling transfer of large area graphene grown by chemical vapor deposition on Cu" Applied Physics Letters 102, 022101 (2013).
(Continued)

*Primary Examiner* — Nicholas A Smith
(74) *Attorney, Agent, or Firm* — Knobbe Martens Olson & Bear, LLP

(57) ABSTRACT

A method for transferring a graphene layer from a metal substrate to a second substrate is provided comprising: providing a graphene layer on the metal substrate, adsorbing hydrogen atoms on the metal substrate by passing protons through the graphene layer, treating the metal substrate having adsorbed hydrogen atoms thereon in such a way as to form hydrogen gas from the adsorbed hydrogen atoms, thereby detaching the graphene layer from the metal substrate, transferring the graphene layer to the second substrate, and optionally reusing the metal substrate by repeating the aforementioned steps.

16 Claims, 2 Drawing Sheets

(56) References Cited

OTHER PUBLICATIONS

Gao et al. "Repeated growth and bubbling transfer of graphene with millimetre-size single-crystal grains using platinum" Nature Communications, 3:699, DOI:10.1038/ncomms1702, 2012.
Kim et al. "Large-scale pattern growth of graphene films for stretchable transparent electrodes" Nature, vol. 457, Feb. 5, 2009, pp. 706-710.
Lee et al. "First-principles study of preferential sites of hydrogen incorporated in epitaxial graphene on 6H-SiC(0001)" Physical Review B 81, 075432 (2010).
Wang et al. "Electrochemical Delamination of CVD-Grown Graphene Film: Toward the Recyclable Use of Copper Catalyst" ACSNANO, vol. 5, No. 12, 9927-9933, 2011.

* cited by examiner dified, invent, or fabri
METHOD FOR TRANSFERING A GRAPHENE LAYER

INCORPORATION BY REFERENCE TO RELATED APPLICATION

Any and all priority claims identified in the Application Data Sheet, or any correction thereto, are hereby incorporated by reference under 37 CFR 1.57. This application claims the benefit of European Application No. 13184696.6 filed Sep. 17, 2013. The aforementioned application is incorporated by reference herein in its entirety, and is hereby expressly made a part of this specification.

TECHNICAL FIELD OF THE INVENTION

A method of graphene synthesis and of graphene layer transfer from a synthesis substrate to a target substrate is provided.

BACKGROUND OF THE INVENTION

The synthesis of high quality graphene is one of the hurdles to tackle on the road to graphene devices for advanced technology nodes.

There are several methods known for growing graphene of relatively high quality.

One method consists in annealing crystalline SiC samples to very high temperatures, thereby desorbing Si and triggering the growth of graphene layers at the surface of the wafer (W. De Heer et al., PNAS Oct. 11, 2011 vol. 108 no. 41 16900-16905). One of the limitations of this technique is that one is limited to the size of available crystalline SiC wafers. 5 inch is the largest commercially available size and the prize thereof is prohibitive for many applications.

Similar good results were achieved by growth of graphene by Chemical Vapor Deposition (CVD) on a catalyst metal substrate (K. S. Kim et al., Nature 457, 706-710 (2009)). This kind of approach implies however a transfer of the graphene from a first substrate to a target substrate. This step is difficult and critical.

The quality of the grown graphene is highly influenced by the kind of metal catalysts used as a substrate. Initially people started with metal catalysts similar to these used for the growth of carbon nanotubes (CNTs). Typically however, such catalysts allow too much carbon diffusion therein, thereby preventing good graphene growth control. Most of the reports deal with Cu as the metal catalyst, as Cu can be etched easily without damaging the graphene, which enables an easy transfer procedure. Nevertheless Pt has an intrinsic better potential for the growth of high quality graphene, as it can withstand higher temperatures compared to Cu and there are less nucleation points, resulting in bigger graphene grains.

An important drawback from growing on Pt, is that Pt is difficult to etch and expensive. The cost to deposit Pt and etch it after the growth of one graphene layer is too high for production, especially since the etched Pt cannot be recycled after use for the formation of a second graphene layer.

A solution would be to find a way to remove graphene from the Pt template without harming the Pt layer, allowing for a next graphene growth cycle.

In the literature (L. Gao et al., Nature communications 3, article no 699 (2012)), it was demonstrated that this can be achieved by bubbling method which is non-destructive for the Pt substrate as well as for the graphene. In this method, a graphene film was grown on Pt by CVD. Then the Pt substrate with the graphene grown on it was spin-coated with polymethyl methacrylate (PMMA) followed by curing. The resulting structure is a graphene layer sandwiched between a Pt substrate and a PMMA film. Although most of the interface between the Pt and the graphene is not exposed to the outside world, an interface between the Pt and the graphene is exposed at the edge of this structure. Then the PMMA/graphene/Pt is dipped into a NaOH aqueous solution and used as the cathode of an electrolysis cell. $H_2$ is produced at the cathode, thereby forming bubbles. Some of the bubbles formed at the edge of the PMMA/graphene/Pt structure are formed at the interface between the graphene and the Pt substrate accessible at the edge. These bubbles separate the Pt substrate and the graphene at the edge. This separation progresses from the edges of the PMMA/graphene/Pt toward the centre of the structure, until the graphene/PMMA bilayer is detached from the Pt substrate. However, the graphene film which could so be removed from the Pt was of small dimension (3 $cm^2$) and it is doubtful that this method permits the transfer of larger graphene films without damage. There is therefore a need in the art for another method.

SUMMARY OF THE INVENTION

It is an object to provide good methods for transferring a graphene layer from a metal substrate to a second substrate.

It is an advantage of embodiments that large size graphene layers can be transferred with minimal or no damages.

It is an advantage of embodiments that the metal substrate can be recycled.

The above objective is accomplished by a method and device according to the embodiments.

In a first aspect, a method is provided for transferring a graphene layer from a metal substrate to a second substrate comprising:
  a. Providing a graphene layer on the metal substrate,
  b. Adsorbing hydrogen atoms on the metal substrate by passing protons through the graphene layer,
  c. Treating the metal substrate having adsorbed hydrogen atoms thereon in such a way as to form hydrogen gas from the adsorbed hydrogen atoms, thereby detaching the graphene layer from the metal substrate,
  d. Transferring the graphene layer to the second substrate, and
  e. Optionally reusing the metal substrate in a subsequent step a.

Typically, step b may comprise passing protons through the graphene layer, thereby bringing these protons in the vicinity of the metal substrate on which they can adsorb under the form of adsorbed hydrogen atoms.

In an embodiment, the graphene layer may be a graphene monolayer. An advantage of using a graphene monolayer is that protons may diffuse more readily through a graphene monolayer than through a graphene multilayer. Another advantage of the use of a graphene monolayer is that it is a material better suited to form high performance devices such as Field Effect Transistors. Graphene layers of a lower quality such as graphene multilayers may be transferred as well in embodiments of the method. Such graphene multilayers can be used in less demanding applications such as touch screens. However, the method is better adapted to the transfer of a graphene monolayer.

In an embodiment, the metal substrate may be made of a transition metal or of an alloy of transition metals. For instance, the transition metal may be selected from groups 8, 9, 10 and 11 transition metals of the periodic table, especially those of periods 4, 5 and 6.

In an embodiment, the metal substrate may be selected from Cu, Ru, Ir, and Pt substrates. These metal substrates are advantageous because they have a low carbon saturation point, thereby promoting the formation of graphene monolayers. Preferably, the metal substrate is a Pt substrate.

In embodiments, the metal substrate can take the form of a metal layer on another substrate, the other substrate being not necessarily metallic.

In an embodiment, the second substrate can be any substrate. Typically, the second substrate may be a glass substrate or a semiconducting substrate (e.g. a Si or a Ge substrate).

In an embodiment, providing the graphene layer may comprise growing the graphene layer on the metal substrate. This step of growing the graphene layer can be performed by any method known from the person skilled in the art such as but not limited to CVD.

In embodiments, graphene layers of large dimensions can be transferred. For instance, in some embodiments, graphene layers larger than 5 $cm^2$, larger than 10 $cm^2$ or even larger than 50 $cm^2$ can be transferred. In embodiments, this transfer can be operated with no or minimal damages.

In an embodiment, step b may be performed in such a way that the graphene layer does not peel off from the metal substrate during this step. This can for instance be achieved by performing step b in such a way that during this step no hydrogen gas bubbles having a diameter larger than 1 µm is generated between the metal substrate and the graphene layer.

Preferably, this can for instance be achieved by performing step b in such a way that during this step no hydrogen gas bubbles are provided (e.g. generated) between the metal substrate and the graphene layer.

In an embodiment, the edges of the assembly metal substrate/graphene may be sealed with a seal impermeable to protons. This is advantageous as it permits avoiding that hydrogen gas bubbles appear between the metal substrate and the graphene layer. The seal may be in any sealing material known to the person skilled in the art such as but not limited to silicone Alternatively or simultaneously, step b may be performed without any generation of hydrogen gas bubbles having a diameter larger than 1 µm.

Alternatively or simultaneously, step b may be performed without any generation of hydrogen gas bubbles. One way of not generating hydrogen gas bubbles larger than 1 µm is by passing the protons electrically through the graphene layer while setting the current and/or voltage to a level low enough during step b to prevent the generation of hydrogen gas bubbles larger than 1 µm but high enough to permit the protons to pass through the graphene layer. Gas bubbles of 1 µm or less are typically not visible to the naked eye while gas bubbles larger than 1 µm are typically visible to the naked eye.

Preferably, in order not to generate hydrogen gas bubbles, step b may be controlled in such a way that the electrochemical reaction at the metal substrate remains the following:

$$H^+ + Me + e^- \Longleftrightarrow Me\text{-}H(ads) \qquad (1),$$

and avoids the following:

$$2H^+ + 2e^- \Longleftrightarrow H_2(gas) \qquad (2).$$

wherein Me is the metal of the metal substrate and wherein Me-H represents monoatomic hydrogen adsorbed on the Me substrate.

In order to avoid generating hydrogen gas bubbles according to equation (2), step (b) may preferably be performed via a potentiostatic method, i.e. wherein the potential is fixed over the cell.

Another way to adsorb monoatomic hydrogen on the metal, instead of using an electrochemical cell, is to provide a photo acid generator material in contact with the graphene layer, the photo acid generator material being suitable for generating protons upon exposure to a certain light (hv), and exposing the photo acid generator material to the certain light (hv), thereby generating the protons. In this embodiment, the graphene layer is sandwiched between the metal substrate and the photo acid generator.

Since the protons are provided through (the plane of) the graphene layer, the metal substrate at the interface with the graphene is relatively homogeneously enriched in adsorbed hydrogen atoms.

In a first particular embodiment, the hydrogen atoms may be provided electrochemically on the metal substrate by reacting the substrate with protons having passed through the graphene layer.

In this particular embodiment, the metal substrate may be an electrode in an electrochemical cell wherein the adsorbed hydrogen atoms may be electrochemically generated. In this electrochemical cell, a graphitic electrode may for instance be used as a counter electrode. In this first particular embodiment, an acid solution may be used as an electrolyte. For instance, this acid solution may be at a pH in the range −1 to 3. An example of acid is $H_2SO_4$.

In this particular embodiment, the current and/or voltage may for instance be set to a level low enough during step b to prevent the generation of hydrogen gas bubbles larger than 1 µm but high enough to provide the protons.

When an electrolyte is used in step b, step d is preferably performed outside of the electrolyte.

In a second particular embodiment, step b may be performed by:
providing a photo acid generator material in contact with the graphene layer, the photo acid generator material being suitable for generating protons upon exposure to a certain light (hv), and
exposing the photo acid generator material to the certain light (hv), thereby generating the protons.

The photo acid generator may for instance be selected from non-ionic photo acid generators, onium salts, sulfonated esters, iodonium salts and copolymer of vinylidene chloride and methyl acrylate.

For instance, the photo acid generator may be Hydrogen silsesquioxane (HSQ).

The photo acid generator can in some embodiments be comprised in a polymer matrix.

When a photo acid generator is used, step b and c can in some embodiments be simultaneous.

In embodiments, after step b and before step d and preferably before step c, a second substrate may be physically contacted with the graphene layer or with the photo acid generator if present.

In any embodiment, step c may comprise heating up the metal substrate to a temperature sufficient for forming the hydrogen gas.

This hydrogen gas formation may be obtained following the equation:

$$2Me\text{-}H(ads) \Longleftrightarrow 2Me + H_2(g) \qquad (3).$$

Alternatively or simultaneously, step c may comprise increasing the hydrostatic pressure around the metal substrate to a pressure suitable for forming the hydrogen gas. This increase in pressure is most typically obtained by raising the hydrostatic pressure within a chamber comprising the metal substrate. Preferably, for reasons of convenience, heating of the metal substrate is used and an increase of the hydrostatic pressure is not used.

In embodiments, during step c, the second substrate may be pressed against the graphene layer with a pressure of more than 1 bar. For instance, a pressure of more than 1.5 bars such as a pressure of from 1.5 to 3 bars may be suitable. For instance, 2 bars may be used. This pressure may serve to oppose to some extent the pressure build-up due to the formation of the hydrogen gas bubbles during step c. The duration of step c may for instance be from 1 min to 3 h, preferably from 30 min to 3 h, more preferably from 1 h to 2 h.

In a second aspect, a structure is provided comprising:
a. A metal substrate having protons adsorbed at a surface thereof, and
b. A graphene layer overlying the metal substrate.

This structure is an intermediate obtained after step b of the method of the first aspect.

In an embodiment, the structure may further comprise a photo acid generator material in contact with the graphene layer. In this embodiment, the graphene layer is sandwiched between the photo acid generator and the metal substrate In a third aspect, a use is provided of a photo acid generator material for transferring a graphene layer from a metal substrate to a second substrate.

In a fourth aspect, a structure is provided comprising:
a. A metal substrate,
b. A graphene layer overlying the metal substrate, and
c. A photo acid generator material in contact with (e.g. overlaying) the graphene layer.

Particular and preferred aspects of the invention are set out in the accompanying independent and dependent claims. Features from the dependent claims may be combined with features of the independent claims and with features of other dependent claims as appropriate and not merely as explicitly set out in the claims.

Although there has been constant improvement, change and evolution of devices in this field, the present concepts are believed to represent substantial new and novel improvements, including departures from prior practices, resulting in the provision of more efficient, stable and reliable devices of this nature.

The above and other characteristics, features and advantages of the present invention will become apparent from the following detailed description, taken in conjunction with the accompanying drawings, which illustrate, by way of example, the principles of the invention. This description is given for the sake of example only, without limiting the scope of the invention. The reference figures quoted below refer to the attached drawings.

Figure 1:
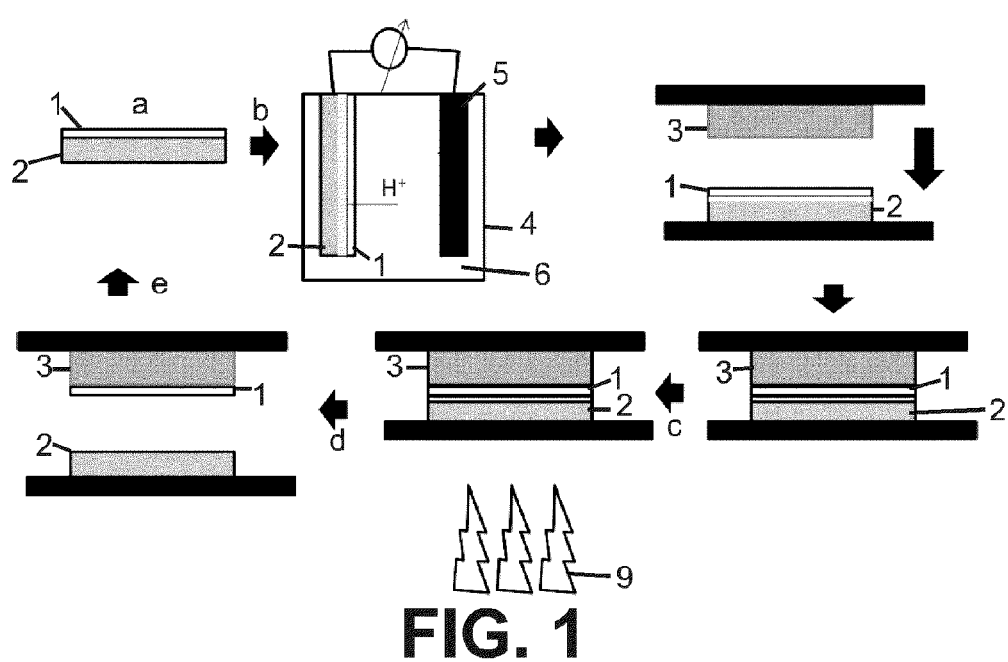
FIG. 1 is a schematic representation of a method according to an embodiment.

In the different figures, the same reference signs refer to the same or analogous elements.

DESCRIPTION OF ILLUSTRATIVE EMBODIMENTS

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Furthermore, the terms "first", "second", "third" and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms "top", "bottom", "over", "under" and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

Furthermore, some of the embodiments are described herein as a method or combination of elements of a method that can be implemented by a processor of a computer system or by other means of carrying out the function. Thus, a processor with the necessary instructions for carrying out such a method or element of a method forms a means for carrying out the method or element of a method. Furthermore, an element described herein of an apparatus embodiment is an example of a means for carrying out the function performed by the element for the purpose of carrying out the invention.

In the description provided herein, numerous specific details are set forth. However, it is understood that embodiments of the invention may be practiced without these specific details. In other instances, well-known methods, structures and techniques have not been shown in detail in order not to obscure an understanding of this description.

The invention will now be described by a detailed description of several embodiments of the invention. It is clear that other embodiments of the invention can be configured according to the knowledge of persons skilled in the art, the invention being limited only by the terms of the appended claims.

FIG. 1 shows a method according to an embodiment. In a first step (a), a graphene layer 1 is provided on a metal (e.g. Pt) substrate 2, thereby providing a metal/graphene assembly. This metal/graphene assembly is then electrically connected to a counter-electrode 5 (e.g. a graphitic anode) via an electrical power source. Both, the metal/graphene assembly and the counter-electrode 5 are then immersed in an electrolyte 6 (e.g. a $H_2SO_4$ solution at a pH of −1 to 3), thereby forming an electrochemical cell 4. In step (b), a constant voltage is applied between the metal substrate 2 and the counter-electrode 5. The voltage is preferentially set to avoid the formation of $H_2$ bubbles larger than 1 µm at this stage (no bubbles are visibly generated). The presence of the voltage drives protons through the graphene layer 1, to the metal substrate 2. This is made possible by the fact that graphene is permeable to protons. Since the protons are provided through the graphene layer (e.g. perpendicularly), the metal substrate at the interface with the graphene ends up relatively homogeneously enriched in adsorbed hydrogen atoms. This provision of adsorbed hydrogen atoms on the metal substrate via the passing of protons through the graphene layer would not be possible if for instance a PMMA layer would be present on top of the graphene layer. PMMA is not permeable to protons. The assembly metal/graphene is thereafter removed from the electrolyte. Next, a second substrate 3 is provided. The substrate 3 is then contacted with the graphene layer 1. The white arrow indicates the action of closing the distance between the second substrate 3 and the graphene layer 1 until contact is established. Some pressure may be applied between second substrate 3 and the graphene layer 1. In the present case, the pressure used is 2 bars and is applied via the use of a bonding tool (represented by the black rectangles in FIG. 1) within which the assembly metal/graphene and the second substrate is situated. The pressure is maintained until the end of step c. In step c, a heat source 9 is used to heat up for 90 min the metal substrate 2 having hydrogen atoms adsorbed thereon in such a way as to form hydrogen gas from the adsorbed hydrogen atoms. Although graphene is permeable to protons, it is not permeable to hydrogen gas. The relatively homogeneous distribution of adsorbed hydrogen atoms at the interface between the substrate and the graphene ensures that hydrogen bubble are generated homogeneously across the whole area of the metal substrate-graphene interface, thereby detaching the graphene layer 1 from the metal substrate 2 (step d). Pressure is then released. The situation in the above describe procedure is in contrast to the situation encountered in L. Gao et al. where hydrogen bubbles are only able to operate at the edges of the substrate/graphene/PMMA assembly and not through the graphene. The metal substrate is not damaged by the process of the present embodiment and can be recycled in a step e to perform step a of providing a graphene layer 1 on the metal substrate 2.

Figure 2:
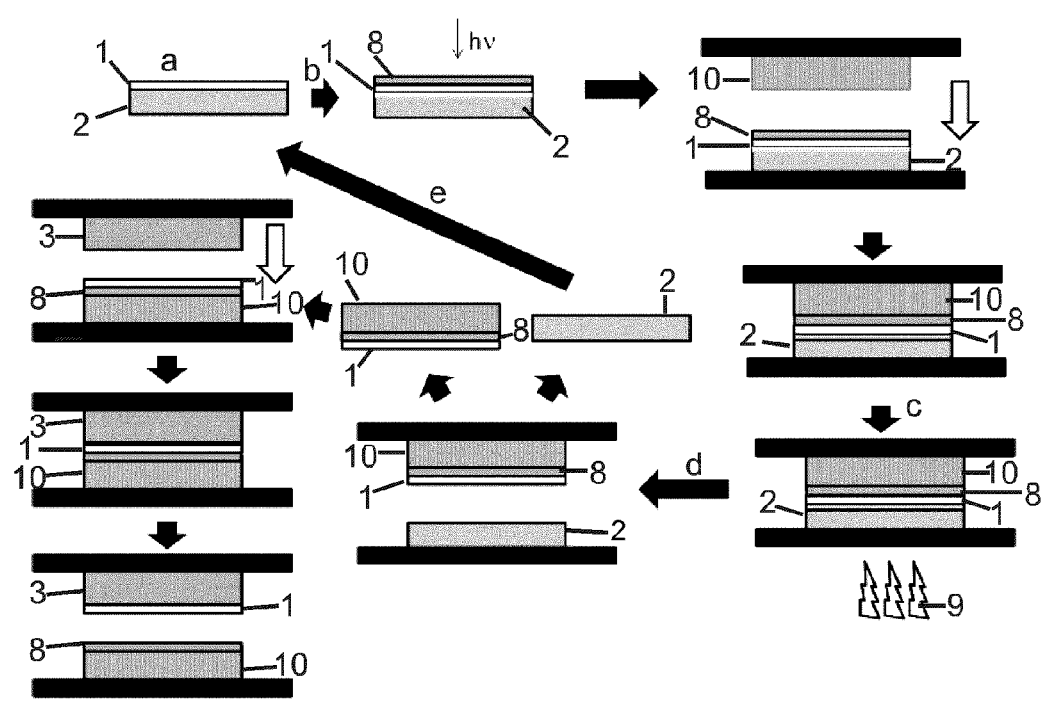
FIG. 2 is a schematic representation of a method according to another embodiment.

FIG. 2 shows a method according to another embodiment. In a first step a, a graphene layer 1 is provided on a metal (e.g. Pt) substrate 2, thereby providing a metal/graphene assembly. The graphene layer of this metal/graphene assembly is then overlaid with a photo acid generator material 8 (e.g. hydrogen silsesquioxane), the photo acid generator material 8 being suitable for generating protons upon exposure to a certain light (hv). The photo acid generator material 8 is then illuminated with the certain light (hv), thereby generating protons, which diffuse through the graphene layer 1 and reach the metal substrate 2. Since the protons are provided through (the main surface of) the graphene layer, the interface between the metal substrate and the graphene ends up relatively homogeneously enriched in adsorbed hydrogen atoms. Next, a second substrate 10 is provided. This second substrate is in the case of FIG. 2 an intermediate substrate 10 (e.g. a glass substrate). The second substrate 10 is then connected with the graphene layer 1 via the photo acid generator material 8 by contacting the second substrate 10 with the photo acid generator material 8. The white arrow indicates the action of closing the distance between the second substrate 10 and the photo acid generator material 8 until contact is established. Some pressure (e.g. 2 bars) may be applied between second substrate 10 and the photo acid generator 8. In step c, a heat source 9 is used to heat up the metal substrate 2 having adsorbed hydrogen atoms thereon in such a way as to form hydrogen gas from the protons. Although graphene is permeable to protons, it is not permeable to hydrogen gas. The relatively homogeneous distribution of adsorbed hydrogen atoms at the interface between the substrate and the graphene ensures that hydrogen bubbles are generated homogeneously across the whole area of the metal substrate-graphene interface, thereby detaching the graphene layer 1 from the metal substrate 2 (step d). The metal substrate is not damaged by this process and can be recycled (step e) to perform step a of providing a graphene layer 1 on the metal substrate 2. The assembly consisting of the second (intermediate) substrate 10, the photo acid generator material 8 and the graphene layer 1 can then be contacted from its graphene layer 1 side with a third (final) substrate 3 (e.g. a silicon substrate), thereby transferring the graphene layer to its final destination, the substrate 3. The photo acid generator material can then be removed from the second (intermediate) substrate 10, thereby permitting the recycling of the second (intermediate) substrate 10.

Other arrangements for accomplishing the objectives of the invention will be obvious for those skilled in the art.

All numbers expressing quantities of ingredients, reaction conditions, and so forth used in the specification are to be understood as being modified in all instances by the term 'about.' Accordingly, unless indicated to the contrary, the numerical parameters set forth herein are approximations that may vary depending upon the desired properties sought to be obtained. At the very least, and not as an attempt to limit the application of the doctrine of equivalents to the scope of any claims in any application claiming priority to the present application, each numerical parameter should be construed in light of the number of significant digits and ordinary rounding approaches.

Where a range of values is provided, it is understood that the upper and lower limit, and each intervening value between the upper and lower limit of the range is encompassed within the embodiments.

All references cited herein are incorporated herein by reference in their entirety. To the extent publications and patents or patent applications incorporated by reference contradict the disclosure contained in the specification, the specification is intended to supersede and/or take precedence over any such contradictory material.

It is to be understood that although preferred embodiments, specific constructions and configurations, as well as materials, have been discussed herein for devices according to the present invention, various changes or modifications in form and detail may be made without departing from the scope of this invention. Steps may be added or deleted to methods described within the scope of the present invention.

What is claimed is:

1. A method for transferring a graphene layer from a metal substrate to a second substrate, comprising:
   a. providing a graphene layer on a metal substrate;
   b. adsorbing hydrogen atoms on the metal substrate by passing protons through the graphene layer by providing a photo acid generator material in contact with the graphene layer, the photo acid generator material being configured to generate protons upon exposure to a certain light, and exposing the photo acid generator material to the certain light, thereby generating the protons;
   c. treating the metal substrate having adsorbed hydrogen atoms thereon so as to form hydrogen gas from the adsorbed hydrogen atoms, thereby detaching the graphene layer from the metal substrate; and
   d. transferring the graphene layer to a second substrate.

2. The method of claim 1, further comprising:
   e. reusing the metal substrate by repeating steps a through d.

3. The method of claim 1, wherein the metal substrate comprises a transition metal or an alloy of transition metals.

4. The method of claim 3, wherein the metal substrate is selected from the group consisting of a Cu substrate, a Ru substrate, an Ir substrate, and a Pt substrate.

5. The method of claim 3, wherein the metal substrate is a Pt substrate.

6. The method of claim 1, wherein the graphene layer is a graphene monolayer.

7. The method of claim 1, wherein the protons are passed electrically through the graphene layer.

8. The method of claim 7, wherein the metal substrate is an electrode in an electrochemical cell.

9. The method of claim 7, wherein, during step b, one or more of a current and a voltage is set to a level so as to provide the protons without generating hydrogen gas bubbles larger than 1 μm.

10. The method of claim 1, wherein, after step b and before step d, a second substrate is physically contacted with the graphene layer.

11. The method of claim 1, wherein, after step b and before step c, a second substrate is physically contacted with the graphene layer.

12. The method of claim 1, wherein, after step b and before step d, a second substrate is physically contacted with the photo acid generator.

13. The method of claim 1, wherein, after step b and before step c, a second substrate is physically contacted with the photo acid generator.

14. The method of claim 1, wherein step c comprises heating the metal substrate to a temperature sufficient for forming the hydrogen gas.

15. The method of claim 10, wherein, during step c, the second substrate is pressed against the graphene layer with a pressure of at least 1.5 bars.

16. The method of claim 12, wherein, during step c, the second substrate is pressed against the photo acid generator with a pressure of at least 1.5 bars.

* * * * *